US007821438B2

(12) United States Patent
Avon et al.

(10) Patent No.: US 7,821,438 B2

(45) Date of Patent: Oct. 26, 2010

(54) DIGITAL-TO-ANALOG CONVERTER CIRCUIT LAYOUT

(75) Inventors: Laurent Avon, Saasenheim (FR); Reiner Bidenbach, Vörstetten (DE); Klaus Heberle, Windenreute (DE)

(73) Assignee: Micronas, GmbH, Freiburg (DE)

( * ) Notice: Subject to any disclaimer, the term of this patent is extended or adjusted under 35 U.S.C. 154(b) by 27 days.

(21) Appl. No.: 12/475,112

(22) Filed: May 29, 2009

(65) Prior Publication Data

US 2009/0295614 A1 Dec. 3, 2009

(30) Foreign Application Priority Data

May 30, 2008 (DE) ....................... 10 2008 026 019

(51) Int. Cl.
*H03M 1/66* (2006.01)

(52) U.S. Cl. ....................... 341/144; 341/136; 341/143; 341/150; 341/153

(58) Field of Classification Search ................. 341/136, 341/143, 144, 150, 153
See application file for complete search history.

(56) References Cited

U.S. PATENT DOCUMENTS 6,292,122 B1 * 9/2001 Younis et al. ............... 341/143
6,346,901 B1 * 2/2002 Aiura et al. ................. 341/153
6,424,824 B1 * 7/2002 Stepp et al. .............. 455/197.3
6,646,580 B2 * 11/2003 Clara et al. ................. 341/136
6,707,408 B2 * 3/2004 Guedon et al. .............. 341/143
6,798,369 B1 * 9/2004 Weber ........................ 341/144
6,917,317 B2 * 7/2005 Nagaso et al. ............... 341/131
6,950,050 B1 * 9/2005 Jordan ........................ 341/144
7,271,754 B2 * 9/2007 Maksimovic et al. ....... 341/152
7,379,005 B2 * 5/2008 Wiesbauer et al. .......... 341/144
7,714,755 B2 * 5/2010 Lee ............................ 341/136
2007/0069933 A1 * 3/2007 Clara et al. ................. 341/143
2007/0268169 A1 * 11/2007 Koo et al. ................... 341/143

* cited by examiner

*Primary Examiner*—Linh V Nguyen
(74) *Attorney, Agent, or Firm*—Muncy, Geissler, Olds & Lowe, PLLC

(57) ABSTRACT

A digital-to-analog converter circuit layout includes a ratiometric digital-to-analog converter. The ratiometric digital-to-analog converter includes a digital data input, a converter voltage output, a voltage controlled oscillator, and a pulse width modulation module. The a digital data input, a converter voltage output, a voltage controlled oscillator, and a pulse width modulation module is configured in a controllable manner for converting digital data received at the input to a converter output voltage at the output using a reference voltage, an adjustable current as a reference current, and an adjustable impedance value. The circuit layout is characterized in that the voltage controlled oscillator includes circuit components which multiply the reference voltage by a quotient between the adjustable impedance value and the adjustable current, and which apply the multiplication results to the pulse width modulation module.

9 Claims, 8 Drawing Sheets

DIGITAL-TO-ANALOG CONVERTER CIRCUIT LAYOUT

PRIORITY INFORMATION

This patent application claims priority from German Patent Application No. 10 2008 026 019.3 filed May 30, 2008, which is hereby incorporated by reference in its entirety.

BACKGROUND OF THE INVENTION

This present invention relates to the field of digital-to-analog converters, and in particular to a digital-to-analog converter circuit that includes a ratiometric digital-to-analog converter.

Generally, digital-to-analog converters that provide ratiometric output values, require resistance dividers. "Ratiometric" refers to where an output voltage is proportionally related to the input voltage of the digital-to-analog converter. For example, where the input voltage doubles, the output voltage doubles. In order to reduce the surface area on circuit layouts for designing a digital-to-analog converter, which is necessary for analog adapted elements and a logic, a structure having two or three stages is necessary for a bit width of n is greater than six (n>6). There are a number of disadvantages in known digital-to-analog converters. For a precise digital-to-analog conversion, the necessary surface area for adapting resistances is related exponentially to the desired precision. In addition, in the case of segmented, resistive digital-to-analog converters, it is necessary to have a high precision, a small offset and a current compensation in order to reduce an inherently poor dynamic noise limitation performance (DNL performance). A low-impedance resistance string may interfere with the reference value, where the reference has a high-impedance output. In contrast, a high-impedance resistance string is more sensitive to switching and leakage currents, and requires a larger surface area. For a high-voltage ratiometric reference, for example, a supply voltage, and all switches which are joined with the conductor must be able to withstand high loads or stresses. As a result, disadvantageously a larger surface area is required for high-voltage MOS types of digital-to-analog converter circuits, and more leakage voltage occurs therewithin.

Therefore, there is a need for a digital-to-analog converter with ratiometric digital-to-analog conversion with reduced complexity.

SUMMARY OF THE INVENTION

A digital-to-analog converter circuit includes a ratiometric digital-to-analog converter. The ratiometric digital-to-analog converter includes a digital data input, a converter voltage output, a voltage controlled oscillator, and a pulse width modulation module. The digital data input, the converter voltage output, the voltage controlled oscillator, and the pulse width modulation module are configured in a controllable manner for converting digital data received at the input to a converter output voltage at the output using a reference voltage, an adjustable current as a reference current, and an adjustable impedance value. The circuit layout is characterized in that the voltage controlled oscillator includes circuit components that multiply the reference voltage by a quotient between the adjustable impedance value and the adjustable current, and which apply the multiplication results to the pulse width modulation module.

A digital-to-analog converter circuit layout with a ratiometric digital-to-analog converter, which is designed for controllably converting incoming digital data to a converter output voltage, includes a reference voltage, an adjustable current as a reference current and an adjustable impedance value. More input signals may also be used.

A voltage-controlled oscillator of the digital-to-analog converter is configured with circuit components for multiplying the reference voltage by a quotient formed between the adjustable impedance value and the adjustable current and for applying the multiplication result to a pulse width modulation module of the digital-to-analog converter.

In this case, circuit components may be designed for multiplying the adjustable impedance value by a first whole number and for dividing the adjustable current by a second whole number. An integrator may be incorporated in the digital-to-analog converter for processing the data received from the pulse width modulation module and that have the multiplied adjusted impedance value and the divided adjusted current. In this embodiment, where the voltage-controlled oscillator is designed to apply the reference voltage that has been multiplied by the quotient between the adjustable impedance value and the adjustable current to the pulse width modulation module in such a way that it is proportional to a digital pulse, and where the integrator is designed to use this digital pulse as an integration time for a constant voltage to a capacitor in the integrator, the duration is proportional to one of the digital values to be converted.

The output voltage of the integrator is proportional to the ratiometric reference voltage and to the converted digital data. Therefore, the ratiometric aspect is based on the provision of a suitable reference voltage in the voltage-controlled oscillator, the reference voltage being multiplied by a corresponding quotient between the capacitive ratio and the current ratio and both of these values being considered later in the integrator for a back-calculation. In this way, the unit pulse period may be made proportional to the ratiometric reference voltage.

Such a circuit layout may be configured with circuit components for providing the two whole numbers X, Y, where $(X \cdot Y)=2^n$ and n is the bit width of the digital data to be converted.

The voltage-controlled oscillator, the pulse width modulation module and the integrator may be configured as a one-stage digital-to-analog converter.

The reference voltage may be provided to the voltage-controlled oscillator as a ratiometric high impedance reference value by a voltage divider string of resistances from a supply voltage with a higher voltage value. This makes it possible to design the actual components of the digital-to-analog converter, including the voltage-controlled oscillator and the integrator, from low-voltage components. Such a reference voltage, which is divided by the quotient between the adjustable impedance value and the adjustable or adjusted current or multiplied therewith may be formed as a compromise between using up the surface area on the circuit layout and the impedance.

The voltage-controlled oscillator may include an operational amplifier, wherein the reference voltage or a positive-value component of the reference voltage is applied to the first input of the operational amplifier and circuit components for applying a quotient value between the adjustable impedance value and the adjustable current are connected to the second input of the operational amplifier.

The digital-to-analog converter may be configured for converting digital data, where the digital data has a bit width of 8 or more bits, and in some embodiments, between 8 to 12 bits.

The configuration of this aspect and other aspects may be implemented by persons skilled in the art, preferably using hardware technology. A standalone or combined implementation of circuit components is also possible, however, using suitable processors and by executable program instructions stored in the layout or that may be applied to it.

Thus, a one-stage ratiometric digital-to-analog converter with inherent, good differential nonlinearity/dynamic noise limitation is provided with the use, for example, of only, for example, a single ratiometric reference. In some embodiments, the single ratiometric reference is a reference voltage such as a single capacitance ratio or a single current ratio.

This is made possible in particular by the fact that a digital pulse—the duration of which is proportional to the digital value that will be transformed or converted, the latter being known as a pulse width modulation technique, and which is proportional to the ratiometric reference value—will be used as the integration time for a constant current to a capacitor or a capacitive value for a digital-to-analog conversion. The output voltage is proportional to the ratiometric reference and the data which are converted by the conversion. The ratiometric aspect of the circuit layout is implemented in this case with a voltage-controlled oscillator. With such a layout, the unit pulse period is proportional to the ratiometric reference value.

Various disadvantages of known solutions may be reduced or eliminated with such a circuit layout. Thus, the adjustment of values such as capacities, currents and offsets for the digital-to-analog converter circuit layout has no effect on the differential nonlinearity ("DNL") and no effect on the integral nonlinearity ("INL") performance of the digital-to-analog converter. Adjustments of this type may only have an effect on the amplification, and such an effect may be simply adjusted or equilibrated by suitable current trimming. The present digital-to-analog converter will thus be used as a current reference for the voltage-controlled oscillator and/or for an integrator component.

The use of a single stage avoids the requirement for a segmented digital-to-analog converter structure. Ratiometric references with high impedance may be directly switched to a comparator of the voltage-controlled oscillator, the comparator typically having a high impedance, for example, metal oxide semiconductor ("MOS") gate input.

Where the ratiometric reference or reference voltage is to be divided, this may be performed by multiplying with a factor proportionally related thereto. The factor may be selected as a compromise value between the surface area requirement in the construction of the circuit layout and the impedance as sole criteria. An adjustment error, in turn, may influence only the amplification, which may be easily equilibrated. A switch is not necessary in order to connect the ratiometric reference with the voltage-controlled oscillator, which avoids leakage voltage interference. In addition, only a relatively small number of switches are necessary in the main digital-to-analog converter part, which reduces interference and provides for logical decoding with less complexity.

For the case when the ratiometric reference value is a high voltage for a specific phase, e.g., where the digital-to-analog converter is not enabled, a single protective device is sufficient, in order to protect the entire digital-to-analog converter, which may only require low-voltage components. Where the ratiometric reference is a high voltage, which is applied during the digital-to-analog conversion operation, it may be divided to obtain a lower voltage, which then makes it possible to operate the entire digital-to-analog converter with the use of low-voltage specifications. The phrase "high voltage" refers to voltages that are higher than the voltages which are used for the operation of the digital-to-analog converter or its components. Thus, in the case of integrated circuits, the low voltage for the digital-to-analog converter or its components particularly lies at approximately 5 V, 3.3 V or even lower, depending on the technology used. In contrast, within the scope of this description, a voltage which lies, e.g., in the range of approximately 14 or 28 V or higher is designated as "high voltage", when applied to motor-vehicle electronics.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
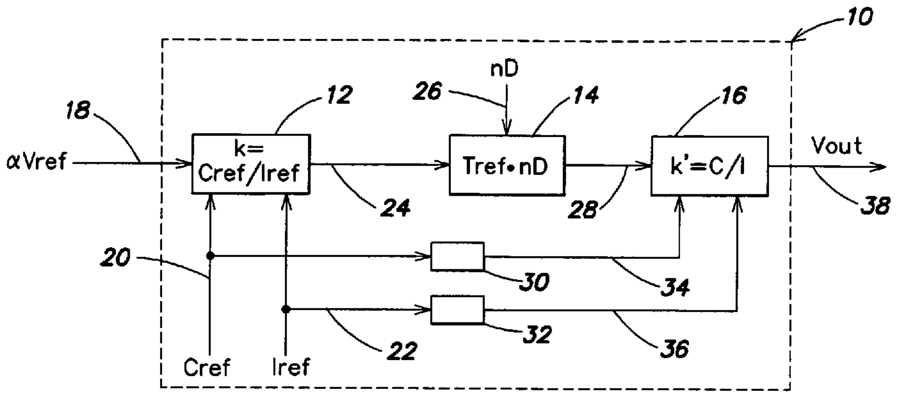
FIG. 1 is a block diagram illustration of a digital-to-analog converter.

FIG. 1 is a block diagram illustration of a digital-to-analog converter ("DAC") 10. The digital-to-analog converter 10 includes a voltage-controlled oscillator ("VCO") 12, a pulse width modulation module ("PWM") 14, and an integrator ("INT") 16.

A reference value, such as a reference voltage Vref on line 18, is applied as a reference to the voltage-controlled oscillator 12. The signal Vref applied to the voltage-controlled oscillator 12 may be multiplied by a factor "α" proportionally related to the reference voltage Vref. In addition, an adjustable or an adjusted (i.e., a particular) impedance value Cref (e.g., capacitance), and an adjustable or an adjusted current Iref are applied to the voltage-controlled oscillator 12 on lines 20, 22 respectively. An impedance-to-current ratio ("k") is defined from the adjusted impedance value Cref and the adjusted current Iref, where k=Cref/Iref. A signal, such as a proportional period Tref of the voltage-controlled oscillator 12, is output from the voltage-controlled oscillator 12 on line 24. The proportional period Tref is equal to the product of the values previously input into the voltage-controlled oscillator 12, that is, Tref=k·αVref.

The proportional period Tref from the voltage-controlled oscillator 12 and digital data ("nD") are input to the pulse width modulation module 14 from lines 24, 26 respectively and processed together, where the digital data nD is to be converted into an analog signal. Data or, respectively, a data or a signal sequence is output on line 28 as a data period ("Td").

The adjusted impedance value Cref is input on the line 20 into element 30 and multiplied by a first whole number "X". The adjusted current Iref is input on the line 22 into element 32 and divided by a second whole number "Y". The signal (X·Cref) is output from element 30 on line 34, and the signal (Y·Iref) is output from element 32 on line 36.

The received data or data period Td on the line 28, the signal (X·Cref) on the line 34 and the signal (Y·Iref) on the line 36 are input into the integrator 16. The received data or data period Td is processed in the integrator 16 together with an impedance-to-current ratio "k'" for the integration, where k'=X·Cref/(Iref/Y). A converter output voltage Vout is output from the integrator 16 on line 38, where Vout=Td/k'=α·Vref·nD/X·Y.

The digital-to-analog converter 10 may be adjusted on the basis of the reference voltage Vref, the adjusted current Iref and the adjusted impedance value Cref, such that the output signal or the converter output voltage Vout is output ratiometrically for the digital data nD, which is to be made analog.

The foregoing assumed that the digital data nD that form the input values for the digital-to-analog converter 10 had a bit width n or bit resolution of 8 to 12 bits. With this assumption, the converter output voltage is defined as follows:

$$Vout=(\alpha)\cdot Vref \cdot nD/2^n.$$

However, it should be noted that other bit widths may also be converted using the digital-to-analog converter 10.

Referring still to FIG. 1, α is the division factor, which is ratiometrically related to the reference values (i.e., to the reference voltage Vref), to the adjusted impedance value Cref and to the adjusted current Iref. The proportional period Tref of the voltage-controlled oscillator 12 in this case corresponds to the product (Tref α·Vref·nD) as the ratiometric period of the voltage-controlled oscillator 12. The two whole numbers X, Y are linked and are formed according to the condition $X\cdot Y=2^n$.

The preceding formula has already proceeded from the circumstance that the reference voltage Vref is formed as a derived value from a supply voltage Vevdd prioritized for the circuit layout which is shown, where Vevdd=1/α·Vref.

The converter output voltage Vout is correspondingly divided by α or multiplied by 1/α in order to obtain $Vo=Vref\cdot nD/2^n$. Where the capacitors, which provide the adjusted impedance value Cref, have a sufficient linearity, such a ratiometric converter output voltage Vout may be obtained at the output of the integrator 16 by setting the two whole numbers according to $X\cdot Y=2^n\cdot\alpha$.

An error adjustment between the corresponding capacitors and/or current sources for providing the adjusted impedance value Cref or the adjusted current Iref for the voltage-controlled oscillator 12 and the integrator 16 may, in some embodiments, only have an influence on the amplification. This may be compensated for by fitted adjustment of the adjusted current Iref and/or the second whole number Y, which is used as the quotient for the adjusted current Iref, or also by digital operations on the corresponding additional input values.

Figure 3:
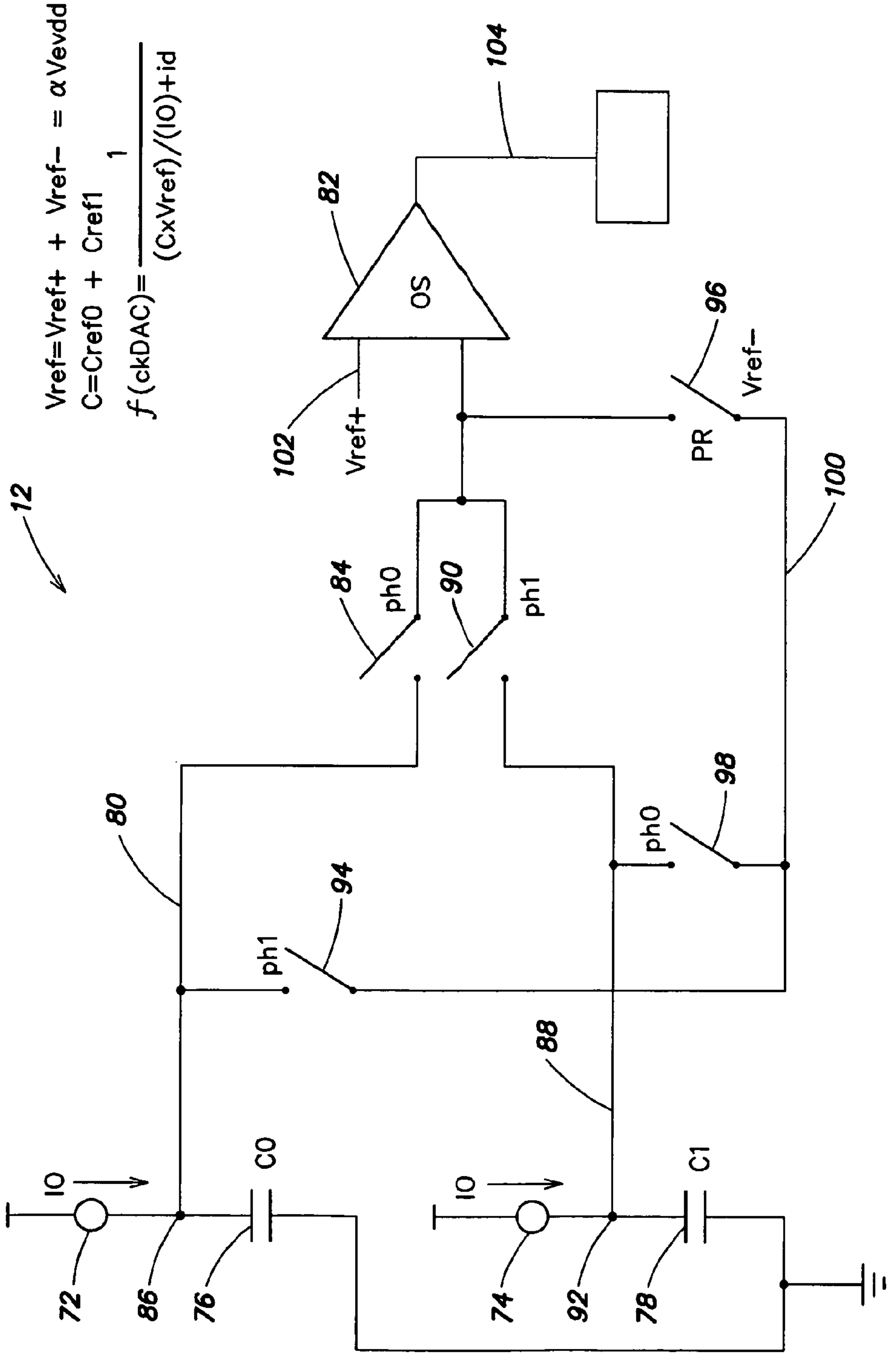
FIG. 3 illustrates an embodiment of a voltage-controlled oscillator of the digital-to-analog converter illustrated in FIG. 1.

In the case of a nonlinearity of the voltage values of the capacitors that provide the adjusted impedance value Cref, the full scaling voltage range of the integrator 16 will be the same as that of the input of the voltage-controlled oscillator 12. That is, as illustrated in FIG. 3, Vref=(Vref−)−(Vref+).

Advantageously, where the supply range for the digital-to-analog converter specification is restricted to low voltage values or low-voltage input values, high-voltage units for the digital-to-analog converter may not be necessary. This may be achieved according to FIG. 2 by a level detection circuit, which compares the reference voltage Vref with a stable band-gap voltage ("Vbg") as a reference, in order to apply a detection signal to an output terminal ("OT") 40 where a maximum input voltage is exceeded.

Figure 2:
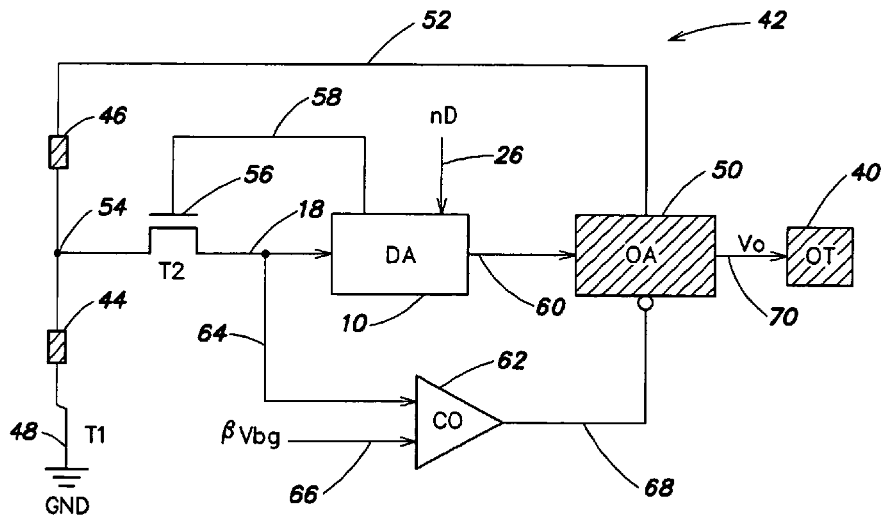
FIG. 2 illustrates an embodiment of a circuit layout for high voltage operation with the digital-to-analog converter illustrated in FIG. 1.

FIG. 2 illustrates one embodiment of circuit components for a circuit layout 42 which includes the digital-to-analog converter 10 illustrated in FIG. 1. The circuit layout 42 includes both a base or ground terminal GND and another terminal for applying a supply voltage Vevdd for a power supply. Two high-voltage resistances ("HVR") 44, 46 and a first transistor ("T1") 48 are connected in series between the ground terminal GND and a terminal for applying the supply voltage Vevdd. The first transistor 48 may be controlled via a control signal "iddq_n". The supply voltage Vevdd may apply a voltage, for example, in a voltage range of approximately −14 V to approximately +26 V. Besides the connection with the first of the high-voltage resistances 44, the terminal also has a connection, via line 52, to an output amplifier ("OA") 50 for applying the supply voltage Vevdd.

From a node 54 between the two high-voltage resistances 44, 46, a line leads over the load path of a second transistor ("T2") 56 to the input of the digital-to-analog converter 10, in order to apply the reference voltage Vref to this DAC 10. The second transistor 56 is controlled via the control signal avdd on line 58, which is provided by the digital-to-analog converter 10 as the control voltage, such that the digital-to-analog converter 10 itself may down-regulate too high a reference voltage. The control voltage from the control signal avdd on the line 58 may, for example, range between approximately 3.4 to 3.6 V. The digital-to-analog converter 10 has an input for introducing digital data nD from the line 26. An output of the digital-to-analog converter 10 for outputting the converter output voltage Vout is applied to an input of the output amplifier 50 via line 60 in order to apply the converter output voltage thereto.

The reference voltage Vref, which is applied from the second transistor 56 to the digital-to-analog converter 10, is also applied to a comparator ("CO") 62 via line 64. A comparison value, which is multiplied by a band-gap voltage factor β, applied with a stable band-gap voltage as a reference, is applied to another input of the comparator 62 via line 66. Where an input voltage (e.g., a maximum input voltage) for the digital-to-analog converter 10, in the form of a maximum allowable reference voltage which is given in advance by this comparison value, has been exceeded, the comparator 62 emits a corresponding signal to the output amplifier 50 via line 68, such that the output amplifier 50 applies a corresponding output voltage Vo on the line 70.

The components shown with cross-hatching in FIG. 2 in addition to the second transistor 56, which, for example, is configured as an NMOS like the first transistor 48, designate high-voltage components or components that are operated with a relatively high operating voltage in comparison to the other components in the digital-to-analog converter 10.

FIG. 3 illustrates one embodiment of the voltage-controlled oscillator 12 for the digital-to-analog converter 10 illustrated in FIG. 1. A reference current I0 is provided from one or two current sources 72, 74 and travels therefrom, through a first capacitor ("C0") 76 and/or a second capacitor ("C1") 78 respectively, to a ground terminal GND. The first and the second capacitors 76, 78 correspondingly provide a first or a second capacitance Cref0, Cref1. A first voltage Vc0 on line 80 may be provided to a first input of an operational amplifier ("OS") 82 via a first switch ("P1") 84, from a tap 86 between the first current source 72 and the first capacitor 76. In addition, a second voltage Vc1 on line 88 may be switched via a second switch ("P2") 90 from a connection point 92 between the second current source 74 and the second capacitor 78. The first of the voltages Vc0 on the line 80 may also be switched via a third switch ("P3") 94 and a reset switch ("PR") 96 to the first terminal of the operational amplifier 82.

The second of the voltages Vc1 on the line 88 may be switched via a fourth switch ("P4") 98 and the reset switch 96 to the first terminal of the operational amplifier 82.

Two different switching signals ph0, ph1 may be applied to this circuit layout or to its first four switches 84, 90, 94, 98. In this case, the first switch 84 and the third switch 94 are controlled by the first of the switching signals ph0, and the second and the fourth switches 90, 99 are controlled by the second of the switching signals ph1. Closing the reset switch 96 causes a first reference voltage Vref− on line 100 to be applied to the first input of the operational amplifier 82. In addition, a second reference voltage Vref+ on line 102 is applied to a second input of the operational amplifier 82. A clocked signal or clock pulse "ckDAC" of the voltage-controlled oscillator 12 is output on line 104 by the operational amplifier 82.

According to FIG. 3, a total capacitance C is a representative value for the adjusted impedance value Cref from the sum of the two capacities Cref0, Cref1 of the two capacitors 76, 78 such that C=Cref0+Cref1. In addition, the reference voltage Vref is formed from the subtraction of the two voltage components such that Vref=(Vref+)−(Vref−)=α·Vevdd. A frequency f(ckDAC) of the signal of the voltage-controlled oscillator 12 is formed at its output such that f(ckDAC)=1/((C×Vref)/(I0)+td). In this case, "td" is a time delay of the comparator 62 (FIG. 2) and the corresponding signal-processing logic.

As a result of the foregoing, the following aspects apply to a voltage-controlled oscillator 12 of this type. The reference voltage Vref may be suitably selected as the ratiometric reference voltage, in order to adjust good capacitor linearities or a good linear behavior of the capacitive values.

The supply current or reference current I0 does not need to be absolutely stable with variable temperatures.

However, the adjusted current Iref, as the reference current, should be the same as the supply current I0 of the main clock pulse oscillator source, in order to assure a constant ratio between clock pulses.

Advantageously, there are no restrictions with respect to a start up or run up, since resetting by the reset switch 96 does not depend on the clock pulse ckDAC of the digital-to-analog converter 10 or of the voltage-controlled oscillator 12. Therefore, there are few restrictions with respect to digital aspects.

The pulse width modulation module 14, configured as a PWM generator, may be based on a relatively simple counter, which counts from 1 to nD. The digital data nD to be input as the load is synchronized with the system timing cycle of the circuit segment (i.e., with the clock pulse ckDAC), which is provided by the voltage-controlled oscillator 12 in the digital-to-analog converter 10.

Figure 4:
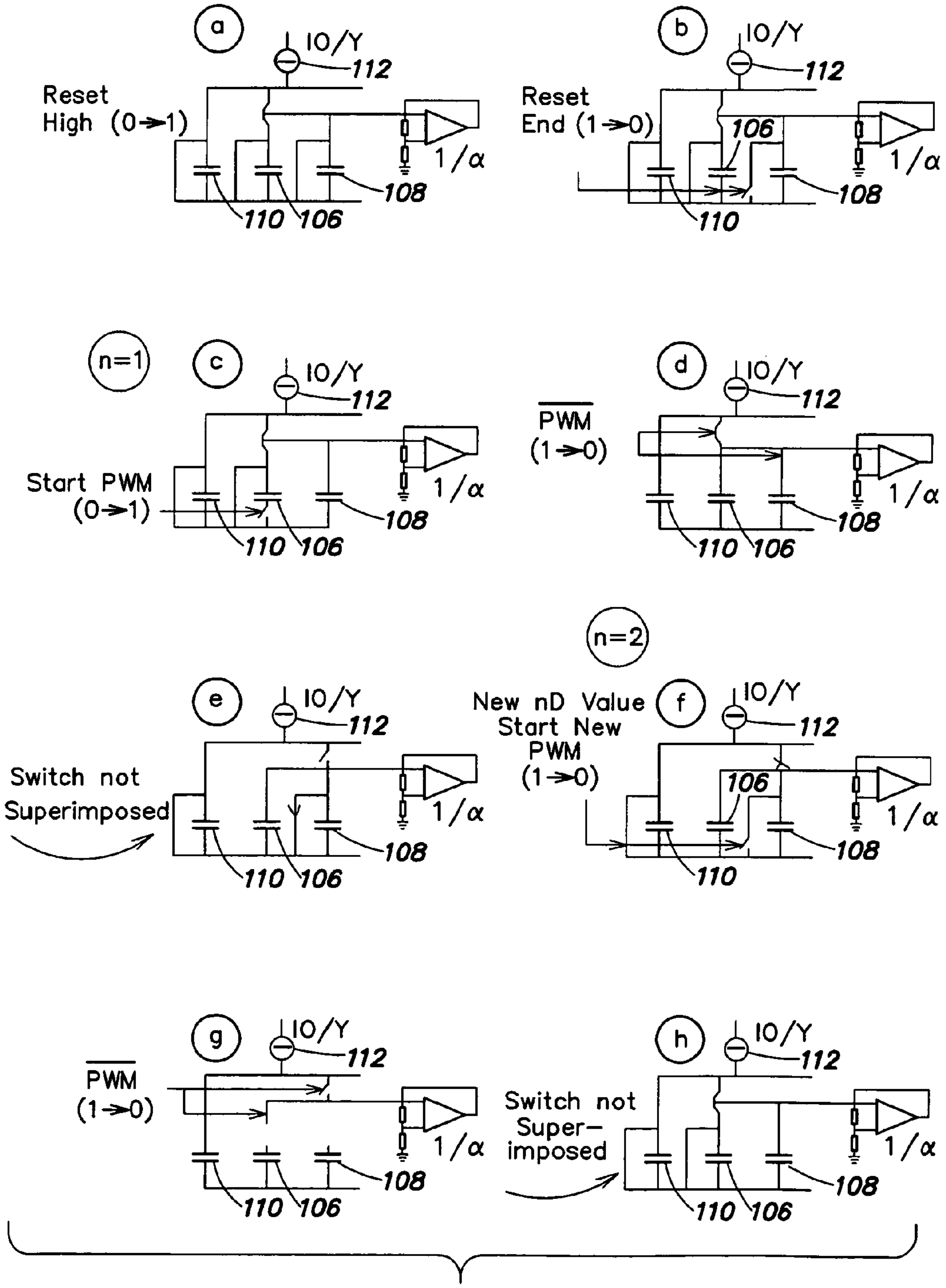
FIG. 4 illustrates an embodiment for logic control for a digital-to-analog converter with pulse frequency modulation.
Figure 5:
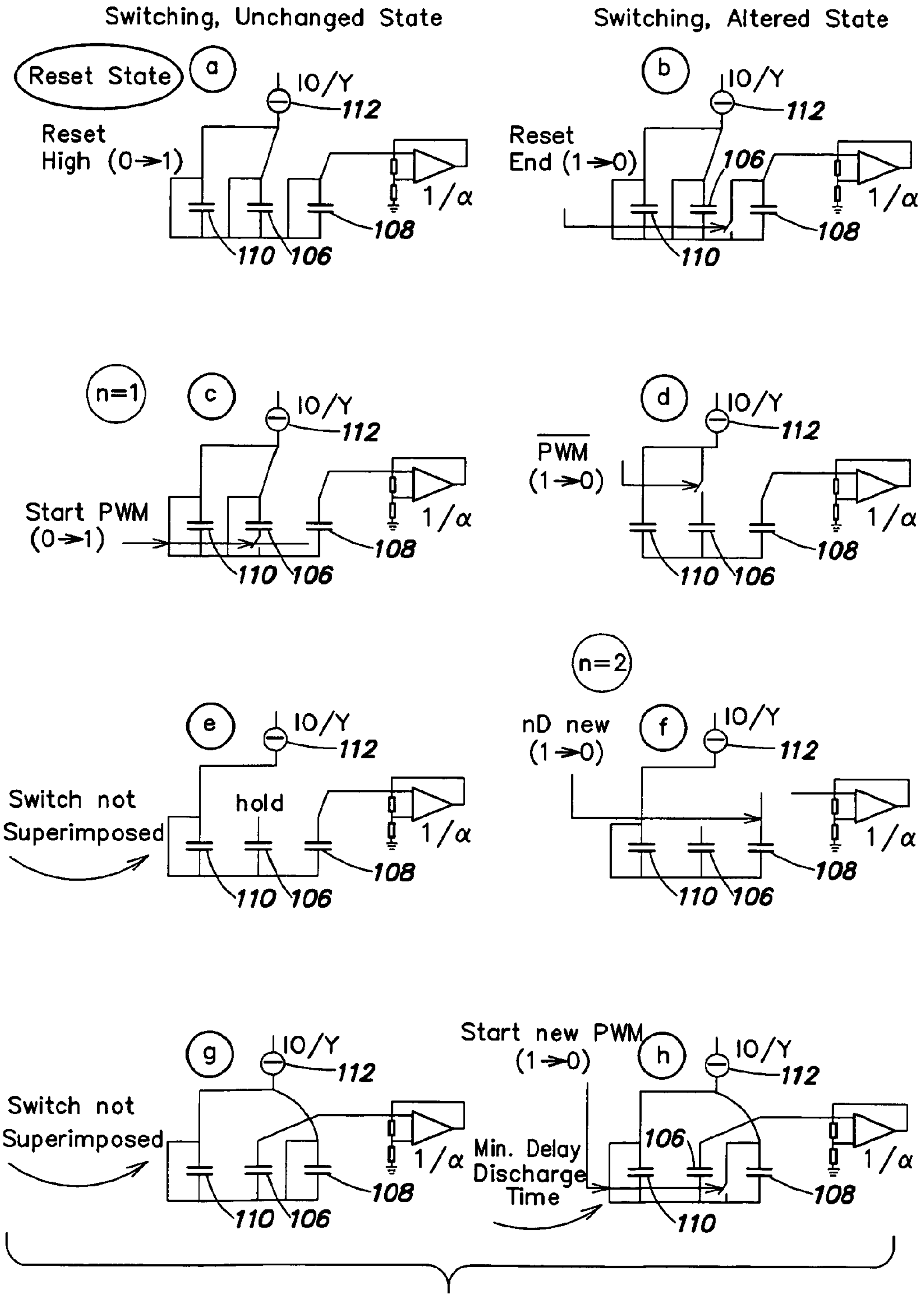
FIG. 5 depicts various illustrations of periodic measurements in the case of a pulse width modulation.

Circuit components and method steps for integration as well as in a sample-and-hold circuit, which are contained in the integrator 16, are described using FIGS. 4 to 6.

A start of an integration may be determined either by the end of a preceding pulse width modulation according to the switching diagrams in FIG. 4, or, where new digital data nD is provided, which is output as a new value signal, by components and steps according to FIGS. 5 and 6. For this example, the integration step and the sample-and-hold circuit or sample-and-hold step are combined. In this way, one component, for example, a third capacitor ("C3") 106 of the integration capacitor, e.g., the total capacitor 110+third capacitor 106 will be used below as a hold capacitor, while the other capacitor, e.g., the fourth capacitor ("C4") 108, is connected to the common capacitor ("Ccom") 110 in order to form the new integration capacitor.

In this case, it is preferred that the third and the fourth capacitors 106, 108 are equally dimensioned.

Figure 6A:
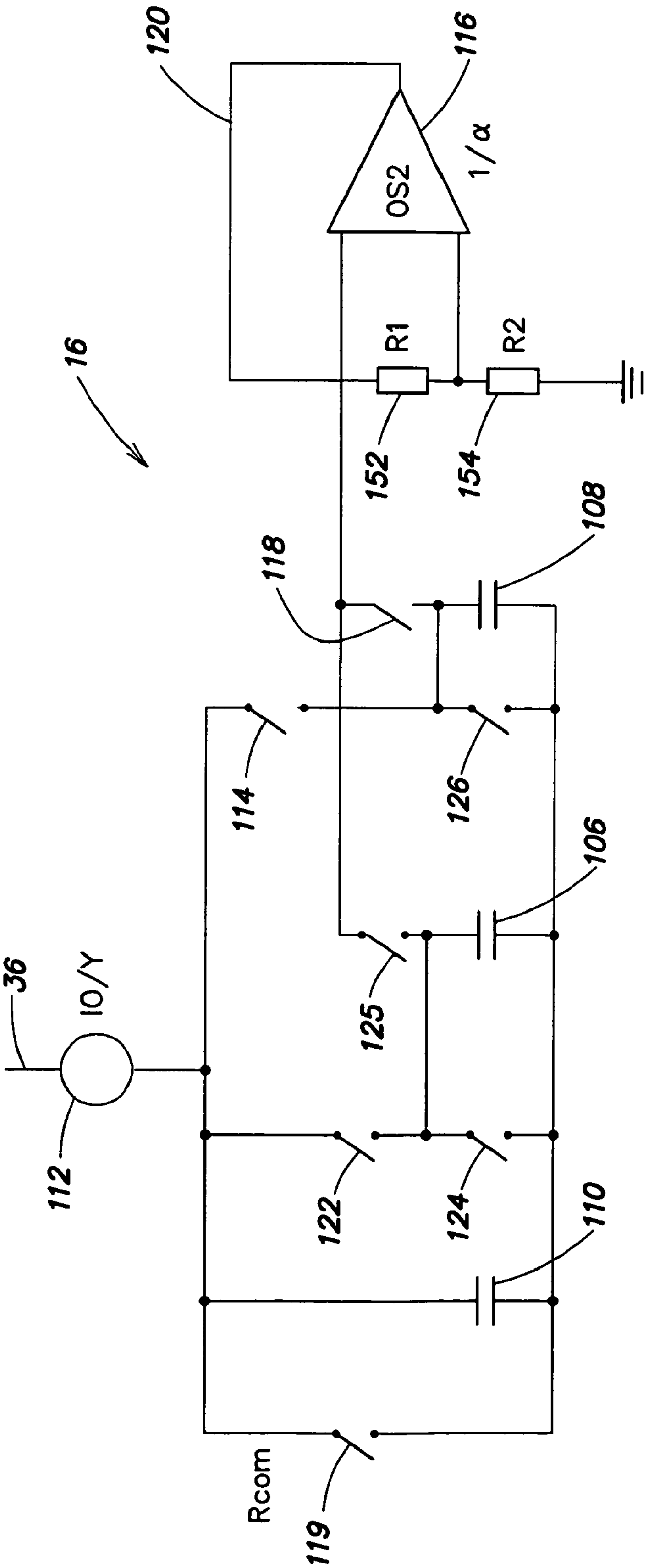
FIGS. 6A-6B illustrates an embodiment of circuit components and signal flows over time for a switching sequence for the digital-to-analog converter in FIG. 1.

FIG. 6A illustrates a schematic circuit layout of one embodiment of the integrator 16 as a sample-and-hold circuit. The quotient of the adjusted current Iref is input via the line 36 as the reference current, which corresponds to the supply current I0 of FIG. 3 and is divided by the second whole number Y. This is converted by a current source 112 to which a plurality of additional components is connected. The divided current may be provided to a node as a fourth current ("Ic4") via a fifth switch ("P5") 114. The divided current at the node is provided to a first input of a second operational amplifier ("OS2"). The output of the second operational amplifier 116 is back-coupled to its first input via line 120. In addition, this first input is connected to another input of the second operational amplifier 116 via a first resistor ("R1") 152. This additional input of the operational amplifier 116 is connected to another, second resistor ("R2") 154 on the ground terminal GND.

The current as a total current "Rcom" may be switched via a sixth switch ("P6") 119, in each case, to a first input of a generally wired capacitor or total capacitor ("Ccom") 110, of a third and a fourth capacitor 106, 108. The total capacitor 110 is connected in parallel by its second terminal to the sixth switch 119 and thus is connected to the divided input or supply current I0/Y on the line 36 of the integrator 16.

The terminal for applying the divided supply current I0/Y on the line 36 may also be switched via an eleventh switch ("P11") 122 to a node which is connected to the second input of the third capacitor 106. In addition, a tenth switch ("P10") 124 is connected in parallel to the third capacitor 106, in order to be able to short-circuit its two terminals, such that a bypass current ("Rc3") may flow between the two terminals of the third capacitor 106. The second terminal of the third capacitor 106 may be switched at the input terminal of the operational amplifier 116 by a ninth switch ("P9") 125, such that a discharge current ("Oc3") may flow from the third capacitor 106 to the operational amplifier 116.

In a corresponding manner, the divided supply current I0/Y on the line 36 may be switched via the fifth switch 114 to the second terminal of the fourth capacitor 108 as the fourth current Ic4 flowing therethrough. Correspondingly, a discharge current ("Oc4") may be switched via the seventh switch 118 from the second terminal of the fourth capacitor 108 to the first input of the operational amplifier 116. An eighth switch ("P8") 126 is connected in parallel to the fourth capacitor 108, such that the inputs or terminals of the fourth capacitor 108 may be short-circuited by the eighth switch 126, such that a bypass current Rc4 flows between these terminals.

Figure 6B:
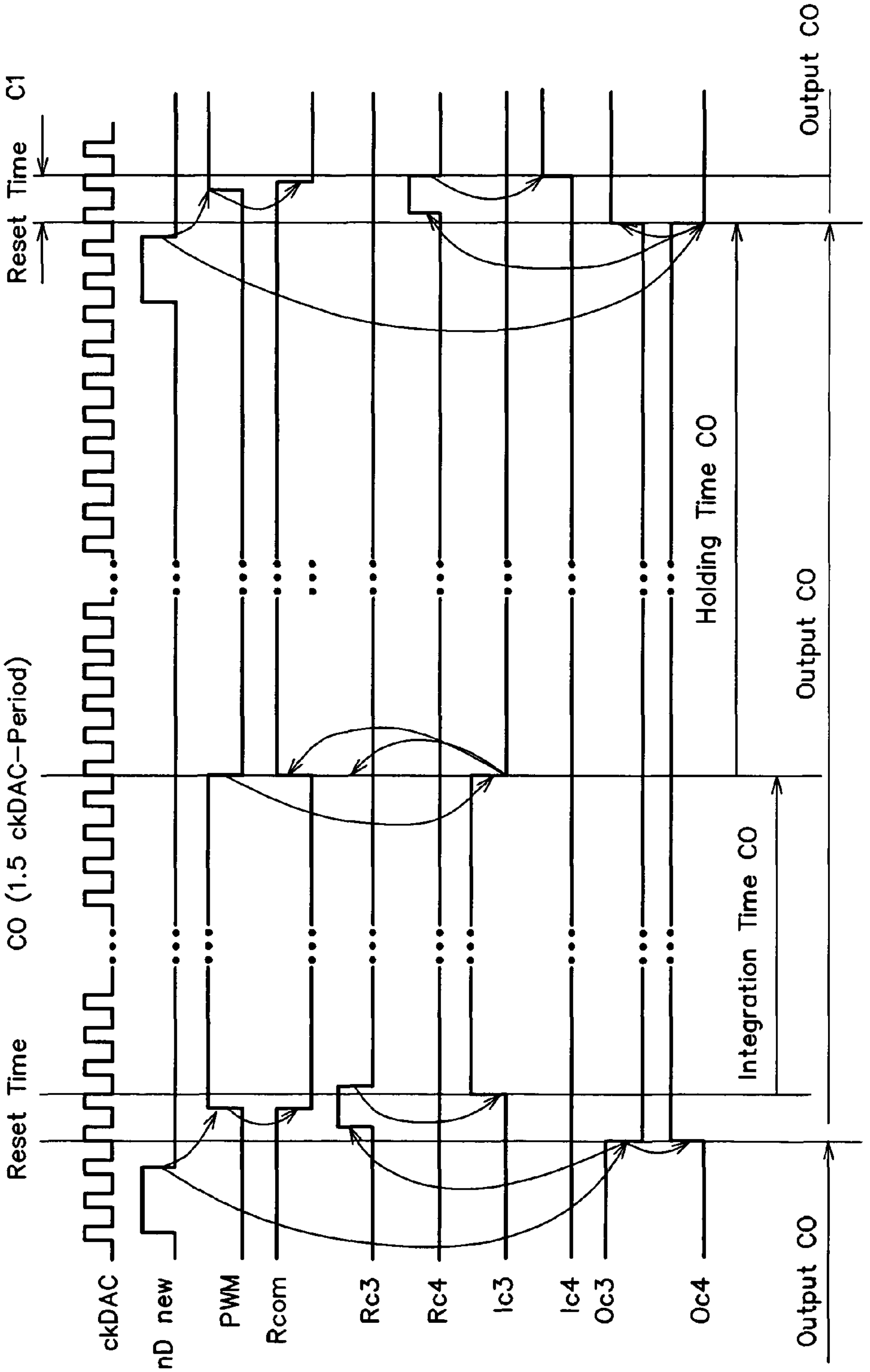

In FIG. 6B time diagrams are shown for the individual signals or currents corresponding to the circuit in FIG. 6A. Where the individual signals or currents or states are connected by one of the switches, they alternate between a high level and a low level.

Referring to FIG. 6B, in the uppermost line, the clock pulse ckDAC of the digital-to-analog converter 10 is illustrated, which is turned on or turned off continually or alternates between two switching states. In the second line from the top, a high level is signaled when a new digital value nD is input into the digital-to-analog converter 10. The duration of the high level, in this case, corresponds to two cycles of the clock pulse ckDAC. An output of the value of the third capacitor 106 occurs up to one cycle later.

In the third line, the signal state of the output of the pulse width modulation module 14 is reproduced. This pulse width modulation module 14 alternates two cycles of the clock pulse ckDAC after the falling off of the flank of the newly input value nD from the low-level to the high-level state. In the high-level state, the output value of the pulse width modulation module 14 remains for a duration equal to one integration time via the values of the third capacitor 106, after which there is a dropping off to the low-level state of this signal.

The fourth line shows the total current Rcom, which initially has a high-level state and passes over into the other, low-level or turned-off state upon a state change of the output value of the pulse width modulation module 14 or directly after this change. In this way, the state of the total current Rcom is in the state that is opposite to the output value of the pulse width modulation module 14.

The fifth line shows the bypass current Rc3, which flows when the tenth switch 124 is closed between the two outputs of the third capacitor 106. From the low-level or zero value, this bypass current Rc3 alternates one and one-half cycles of the clock pulse ckDAC after the input of the next new digital value nD for one and one-half cycles in the high-level state, in which the two terminals of the third capacitor 106 are short-circuited and the bypass current flows. Therefore, the change to the high-level state is made simultaneously with the falling flank prior to the passage of the output value of the pulse width modulation module 14 to the high-level state.

The sixth line shows the bypass current Rc4 for the fourth capacitor 108, which then passes into the high-level state, where the eighth switch 126 is closed. The eighth switch 126 is closed one total period later, i.e., after the input of another new nD value. At this time point, the tenth switch 124 is not switched, but remains in the open-circuit state. In the present example, the eighth switch 126 will be switched for a duration of one and one-half cycles of the pulse clock ckDAC in the conducting state, such that the capacitor 108 is discharged.

The seventh line shows the third current Ic3, which is then switched from the zero value to the high-level state by the flowing current, where the bypass current Rc3 is switched to the low-level or turned-off state for the third capacitor 106. The third current Ic3 remains in the high-level or turned-on state of the eleventh switch 122 up to the end of the integration time via the third capacitor 106.

The fourth current Ic4 remains in the low-level or turned-off state of the fifth switch 114 up to the falling off of the flank of the bypass current Rc4 for the fourth capacitor 108. The fourth current alternates to the high-level state up to the end of one integration time via the fourth capacitor 108.

The seventh and the ninth switches 118, 125 are switched such that the discharge currents Oc3 and Oc4 are in states opposite to one another each clock pulse. Both the seventh switch 118 as well as the ninth switch 125 are switched each time one-half cycle of the clock pulse ckDAC prior to the switching of the eighth or the tenth switch into their high-level or closed conductive state in each case, as is shown in the ninth and the tenth lines in FIG. 6B.

The phases in this case are initially an outputting of the value of the third capacitor 106, following the integration time via the third capacitor 106, and subsequently thereto an outputting of the fourth capacitor 108, which begins at the time point of the output of the value from the third capacitor 106 at the beginning of the switching processes or begins one cycle after inputting the first new nD value and ends at the end of the period shown. A time duration corresponding to the holding time for the third capacitor 106 is found between the end of the integration time via the third capacitor 106 and the end of the period. After inputting another new nD value at the end of the period shown, the output time ends for the fourth capacitor 108 and a new output time for the third capacitor 106 begins.

After inputting the first new nD value, both the output value of the pulse width modulation module 14 is switched to the high-level state and the ninth switch 125 is switched, due to the falling flank of the corresponding signal. Depending on the state of the ninth switch 125, the seventh switch 118 is switched and, a short time thereafter or simultaneously, the tenth switch 124 is also switched. Depending on the switching of the output signal of the pulse width modulation module 14 to the high-level state, the total current Rcom is switched by turning off or opening the sixth switch 118. Due to the falling flank of the bypass current Rc3 for the third capacitor 106, i.e., due to the opening of the tenth switch 124, the eleventh switch 122 is switched closed, such that the third current Ic3 is switched to the high-level state. Its later alteration to the low-level state at the end of the integration time is taken care of by turning off or opening the switch for applying the output value of the pulse width modulation module 14. With the opening of the eleventh switch 122, the holding time for the third capacitor 106 dependent thereon is activated and the sixth switch 119 for applying the total current Rcom is closed. Corresponding steps take place after inputting another new digital value nD. However, the eighth switch 126 is switched instead of the tenth switch 124 and the fifth switch 114 is switched instead of the eleventh switch 122. In addition, the seventh and ninth switches 118, 125 are switched to the opposite state in each case.

To illustrate individual time points, the respective switching states based on FIG. 4 are diametrically illustrated as an example for a particularly simple case of a logic control of the digital-to-analog converter 10 having two adjusted capacitors and for the introduction of a new digital value nD as soon as it is available. An output delay for the input of a new digital value nD is short for low values, and, in contrast, long for high values. A resetting of the total capacitor 110 and of the third capacitor 106 or, correspondingly, of the fourth capacitor 108, is better or longer for low values of the digital-to-analog converter 10. In particular, the case of a pulse frequency modulation is shown in FIG. 4.

FIG. 5 shows the corresponding situations of a pulse width modulation for different switching states.

Figure 7A:
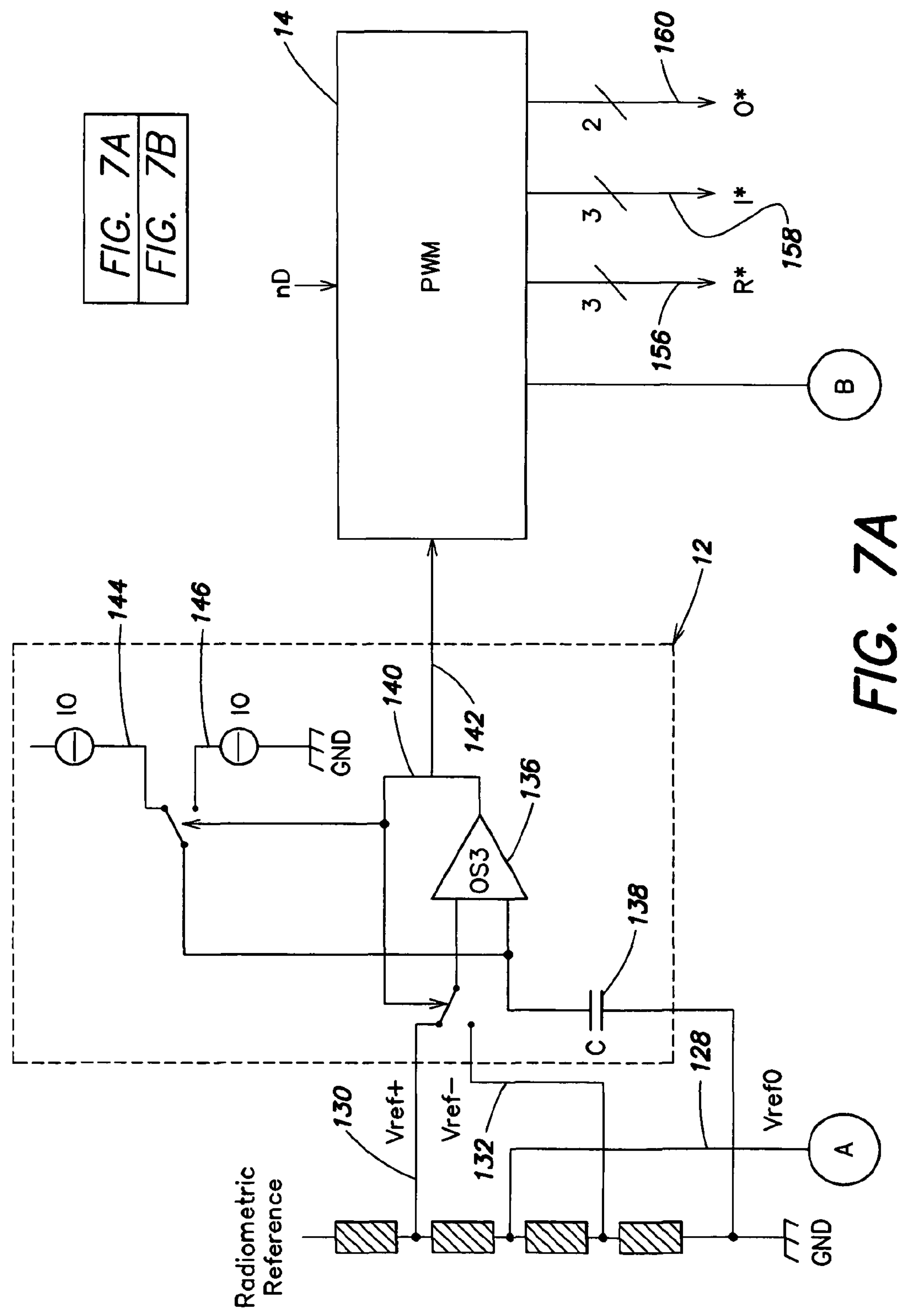
FIGS. 7A and 7B in combination illustrates an alternative embodiment of a digital-to-analog converter circuit layout.
Figure 7B:
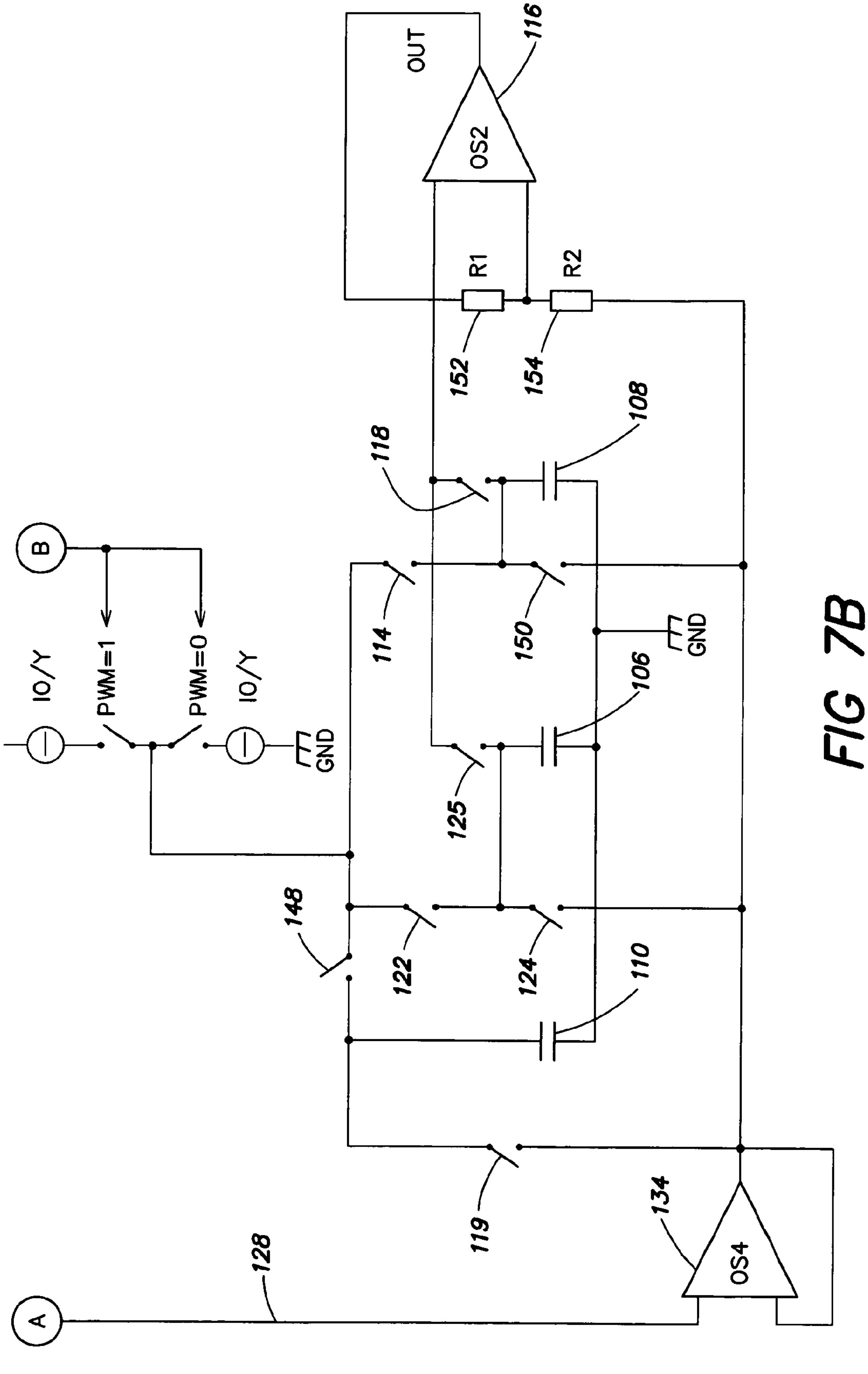

FIGS. 7A and 7B in combination illustrates an alternative embodiment of a corresponding circuit layout for designing a digital-to-analog converter, which is based on the same construction and circuit principle as the layout according to the first embodiment in FIG. 1.

In order to provide the ratiometric reference or reference voltage Vref0 on line 128, Vref+ on line 130, Vref− on line 132, a resistance string is connected in the high-volt range opposite the ground terminal GND. Starting from the ground terminal GND, the negative-value reference voltage Vref− on the line 132 is tapped between the first two of these resistances. The positive-value reference voltage Vref+ on the line 130 is tapped between two resistances that are connected further downstream from the ground terminal GND. The zero reference voltage Vref0 on the line 128 is tapped between these two resistance groups. The Vref0 is applied to an input of a fourth operational amplifier ("OS4") 134, whose other input is connected together with its output.

Either the positive-value reference voltage Vref+ or the negative-value reference voltage Vref− may be switched to an input of a third operational amplifier ("OS3") 136 by a switch. The second input of the operational amplifier 136 is connected to ground via a capacitor ("C") 138. The third operational amplifier 136 outputs the clock pulse ckDAC on line 140, which is applied to the pulse width modulation module 14 as an input signal via line 142. In addition, this output value or timing cycle is used for switching the switch on the input side of the third operational amplifier 136 and another switch. The latter switch switches the reference current I0 on line 144 or supply current I0 on line 146 alternatively from a supply voltage terminal or the ground terminal GND to the second input of the third operational amplifier 136. The layout described thus far having the third operational amplifier 136 as well as the capacitor 138 on the input side of this and the two switches substantially corresponds to the voltage-controlled oscillator 12 of the first embodiment in FIG. 1.

The pulse width modulation module 14 receives the digital data nD as another input value. In addition, switching commands are generated therein and output via corresponding outputs ("R*") on line 156, ("I*") on line 158, and ("O*") on line 160. The pulse width modulation module 14 is able to have several lines for corresponding individual signals. In particular, an on-state or an off-state of the output value of the pulse width modulation module 14 PWM=1 or PWM=0 is output, in order to apply the supply voltage i0, i.e., I0/Y, which is split or divided by the second whole number Y, correspondingly from a supply terminal or the ground terminal GND, to the other circuit, which forms the integrator 16 including the sample-and-hold circuit.

This sample-and-hold circuit is connected on the input side as another input also to the output of the fourth operational amplifier 134, which is wired with the zero reference voltage Vref0. In turn, a sixth switch 119 and a twelfth switch ("P12") 148 are switched between the output value of the fourth operational amplifier 134 and the input of the signal or value from the pulse width modulation module 14. Departing from the circuit layout shown in FIG. 6, however, the first terminals of the total capacitor 110, of the third capacitor 106 and of the fourth capacitor 108 are connected in common to the ground terminal GND. The terminals of the switches ("P10*") 124 or ("P8*") 150 which are connected in parallel to the third capacitor 106 or to the fourth capacitor 108, in contrast, are not connected to the corresponding first terminals of the capacitors, but to the output of the fourth operational amplifier 134. In addition, the second resistance R2 of the operational amplifier 116 is connected to the output of the fourth operational amplifier 134 via several resistors. The other components and circuits correspond to those of the circuit layout according to FIG. 6.

According to the two embodiments in FIGS. 1 and 7A-7B, a digital-to-analog converter circuit 10 layout may be designed, for which the surface area requirement is drastically reduced in comparison to previous solutions, for ratiometric digital-to-analog converters. In this case, resistive conductors or resistances may be used as conductors, for which reason, a small number of components, a small adaptation requirement or tuning requirement and low operating voltages and operations with low operating voltage are possible in the actual digital-to-analog converter 10. The corresponding switches P5-P12, P8*, P10* may also therefore be executed as switchable resistances, particularly MOS-FETs, in particular in the integrator and the sample-and-hold circuit, as is also indicated by the selection of the reference symbols for the currents.

An integrative nonlinearity (INL) may only depend on the linearities of the capacitors or capacitive values and current references. Application in integrated sensors with a width for the digital data of 8 to 12 bits and with ratiometric analog output is particularly advantageous, but not limited thereto.

Although the present invention has been illustrated and described with respect to several preferred embodiments thereof, various changes, omissions and additions to the form and detail thereof, may be made therein, without departing from the spirit and scope of the invention.

What is claimed is:

1. A digital-to-analog converter circuit layout, comprising:

a ratiometric digital-to-analog converter comprising a digital data input, a converter voltage output, a voltage controlled oscillator, and a pulse width modulation module, which ratiometric digital-to-analog converter is configured in a controllable manner for converting digital data received at the input to a converter output voltage at the output using a reference voltage, an adjustable current as a reference current, and an adjustable impedance value; and wherein the voltage controlled oscillator comprises circuit components which multiply the reference voltage by a quotient between the adjustable impedance value and the adjustable current, and which apply the multiplication results to the pulse width modulation module.

2. The circuit layout of claim 1, further comprising circuit components which multiply the adjustable impedance value by a first whole number (X) and divide the adjustable current by a second whole number (Y); and an integrator which processes data received by the pulse width modulation module with the multiplied adjusted impedance value and the divided adjusted current.

3. The circuit layout of claim 2, where the voltage controlled oscillator is configured to apply the reference voltage multiplied by the quotient between the adjustable impedance value and the adjustable current to the pulse width modulation module such that the multiplied reference value is proportional to a digital pulse, has a duration proportional to one of the digital values that are to be converted, and wherein the integrator is configured to use the digital pulse as an integration time for a constant current to a capacitor in the integrator.

4. The circuit layout of claim 2, further comprising circuit components for providing the first and the second whole numbers (X, Y) such that their product is $(X \cdot Y)=2^n$, where n is a bit width of the digital data to be converted.

5. The circuit layout of claim 2, where the voltage-controlled oscillator, the pulse width modulation module and the integrator are configured as a one-stage digital-to-analog converter.

6. The circuit layout of claim 2, where the reference voltage (Vref) is provided to the voltage-controlled oscillator as a ratiometric high-impedance reference value through a voltage divider string made up of resistances from a supply voltage with a higher voltage value.

7. The circuit layout of claim 2, where the voltage-controlled oscillator includes an operational amplifier having a first input which receives the reference voltage or a positive-value component of the reference voltage; and the circuit components which apply the quotient value between the adjustable impedance value and the adjustable current are connected to the second input of the operational amplifier.

8. The circuit layout of claim 1, where the digital data has a bit width of 8 or more bits.

9. The circuit layout of claim 1, where the digital data has a bit width of between 8 to 12 bits.

* * * * *